United States Patent
Power et al.

(10) Patent No.: US 12,512,356 B2
(45) Date of Patent: Dec. 30, 2025

(54) APPARATUS AND METHOD FOR WAFER ALIGNMENT

(71) Applicant: Tokyo Electron Limited, Tokyo (JP)

(72) Inventors: David Power, Albany, NY (US); David Conklin, Albany, NY (US); Anthony Schepis, Albany, NY (US); Andrew Weloth, Albany, NY (US); Anton Devilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 438 days.

(21) Appl. No.: 18/085,354

(22) Filed: Dec. 20, 2022

(65) Prior Publication Data

US 2024/0203778 A1    Jun. 20, 2024

(51) Int. Cl.
| | |
|---|---|
| *H01L 21/68* | (2006.01) |
| *H01L 21/67* | (2006.01) |
| *H01L 21/683* | (2006.01) |
| *H01L 23/544* | (2006.01) |

(52) U.S. Cl.
CPC ...... *H01L 21/681* (2013.01); *H01L 21/67265* (2013.01); *H01L 21/6835* (2013.01); *H01L 23/544* (2013.01); *H01L 2221/68363* (2013.01); *H01L 2223/54426* (2013.01)

(58) Field of Classification Search
CPC ............ H01L 21/67265; H01L 21/681; H01L 21/6835; H01L 2221/68363; H01L 2223/5442; H01L 2223/54426; H01L 2223/54486; H01L 23/544

See application file for complete search history.

(56) References Cited

U.S. PATENT DOCUMENTS

| | | | |
|---|---|---|---|
| 7,474,104 B2 | 1/2009 | Dalton et al. | |
| 9,324,660 B2 | 4/2016 | Zhang et al. | |
| 11,121,091 B2 | 9/2021 | Wagenleitner | |
| 2002/0158193 A1* | 10/2002 | Sezginer | H01L 22/34 |
| | | | 250/237 G |
| 2012/0319307 A1* | 12/2012 | Wang | H01L 23/544 |
| | | | 257/E23.179 |
| 2013/0068826 A1* | 3/2013 | Maki | H01L 24/75 |
| | | | 228/49.5 |
| 2016/0178344 A1 | 6/2016 | Farooq et al. | |
| 2017/0084595 A1* | 3/2017 | Seddon | H01L 23/481 |
| 2021/0375781 A1* | 12/2021 | Lin | H01L 23/544 |

* cited by examiner

*Primary Examiner* — Kidest Worku
(74) *Attorney, Agent, or Firm* — Foley & Lardner LLP

(57) ABSTRACT

A method includes providing a carrier substrate having a die bonded thereto, where the die includes a first alignment mark on a first surface. The method includes positioning a target substrate with a second surface on a substrate stage, where the target substrate includes a second alignment mark on the second surface. The method includes positioning the carrier substrate with respect to a die handler, where the die handler includes a third alignment mark. The method includes coupling the die to the die handler, where the step of coupling includes aligning the first alignment mark with the third alignment mark. The method includes positioning the coupled die and the die handler over the target substrate, where the step of positioning includes aligning the second alignment mark with at least one of the first alignment mark and the third alignment mark. The method includes bonding the first surface with the second surface.

20 Claims, 13 Drawing Sheets

APPARATUS AND METHOD FOR WAFER ALIGNMENT

FIELD OF THE DISCLOSURE

This disclosure relates to microelectronic devices including semiconductor devices, transistors, and integrated circuits, including methods of microfabrication.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for smaller and more creative packaging techniques of semiconductor dies.

Wafer-to-wafer, die-to-die, and die-to-wafer bonding are generally implemented to continue power-performance-area-cost (PPAC) scaling for complex circuits such as are implemented in systems on chip (SOCs). Many bonding techniques rely on accurate alignment between the opposing bonding substrates. While methods of implementing the various bonding processes have been generally adequate, they are not entirely satisfactory in all aspects. For example, it may be desirable to obtain higher order of alignment and positioning for die-to-wafer bonding processes.

SUMMARY

The present disclosure provides various embodiments of apparatus and method for performing a die-to-wafer alignment process for semiconductor device processing.

One aspect of the present disclosure may provide a method that includes providing a carrier substrate having a die bonded thereto, where the die includes a first alignment mark on a first surface. The method includes positioning a target substrate with a second surface on a substrate stage, where the target substrate includes a second alignment mark on the second surface. The method includes positioning the carrier substrate with respect to a die handler, where the die handler includes a third alignment mark. The method includes coupling the die to the die handler, where the step of coupling includes aligning the first alignment mark with the third alignment mark. The method includes positioning the coupled die and the die handler over the target substrate, such that the first surface faces the second surface, where the step of positioning includes aligning the second alignment mark with at least one of the first alignment mark and the third alignment mark. The method includes bonding the first surface with the second surface.

Another aspect of the present disclosure may provide a method that includes loading a target substrate with a first surface onto a substrate stage, where the first surface includes a first alignment mark. The method includes providing a die having a second surface on a carrier substrate, where the second surface includes a second alignment mark. The method includes coupling the die with a die handler, where the die handler includes a third alignment mark, and where the step of coupling includes performing a first alignment process to align the die with the die handler using the second alignment mark and the third alignment mark. The method includes placing the die coupled to the die handler on the first surface of the target substrate, where the step of placing includes performing a second alignment process to align the coupled die and the die handler with the target substrate using the first alignment mark and at least one of the second alignment mark or the third alignment mark. The method includes performing a bonding process to fuse the first surface with the second surface.

Yet another aspect of the present disclosure includes an apparatus that includes a substrate stage configured to receive and move a target substrate, where the substrate stage includes a first alignment mark. The apparatus includes an alignment detection module configured to facilitate an alignment process of the target substrate. The apparatus includes a substrate handler configured to receive and move a carrier substrate having a die disposed thereon, where the die includes a second alignment mark. The apparatus includes a die handler configured to receive and move the die from the carrier substrate, where the die handler includes a third alignment mark corresponding to the first alignment mark and the second alignment mark.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
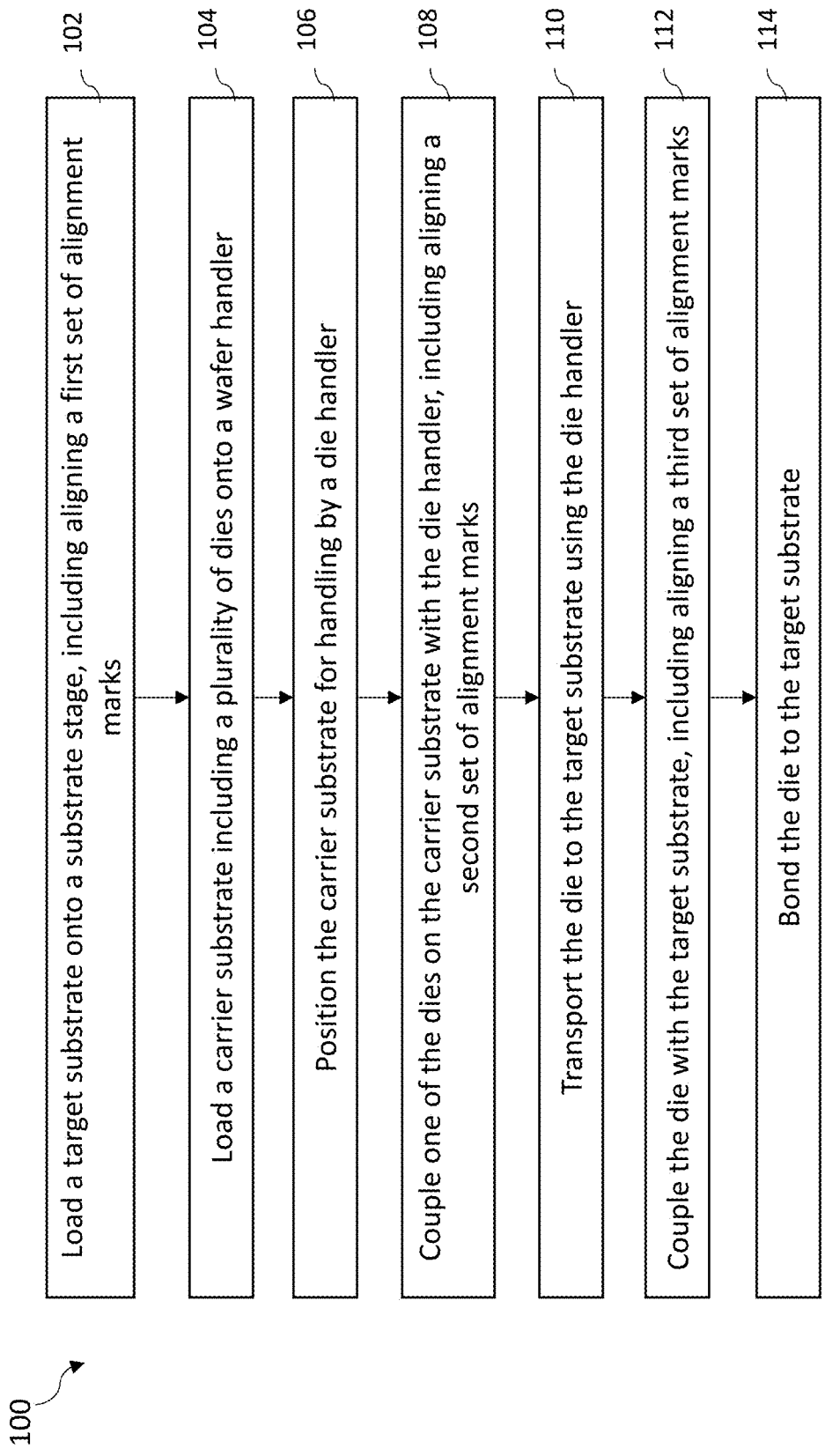
FIGS. 1 and 2 each illustrate a flow chart of an example method for bonding two semiconductor components involving a wafer alignment process, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Figure 2:
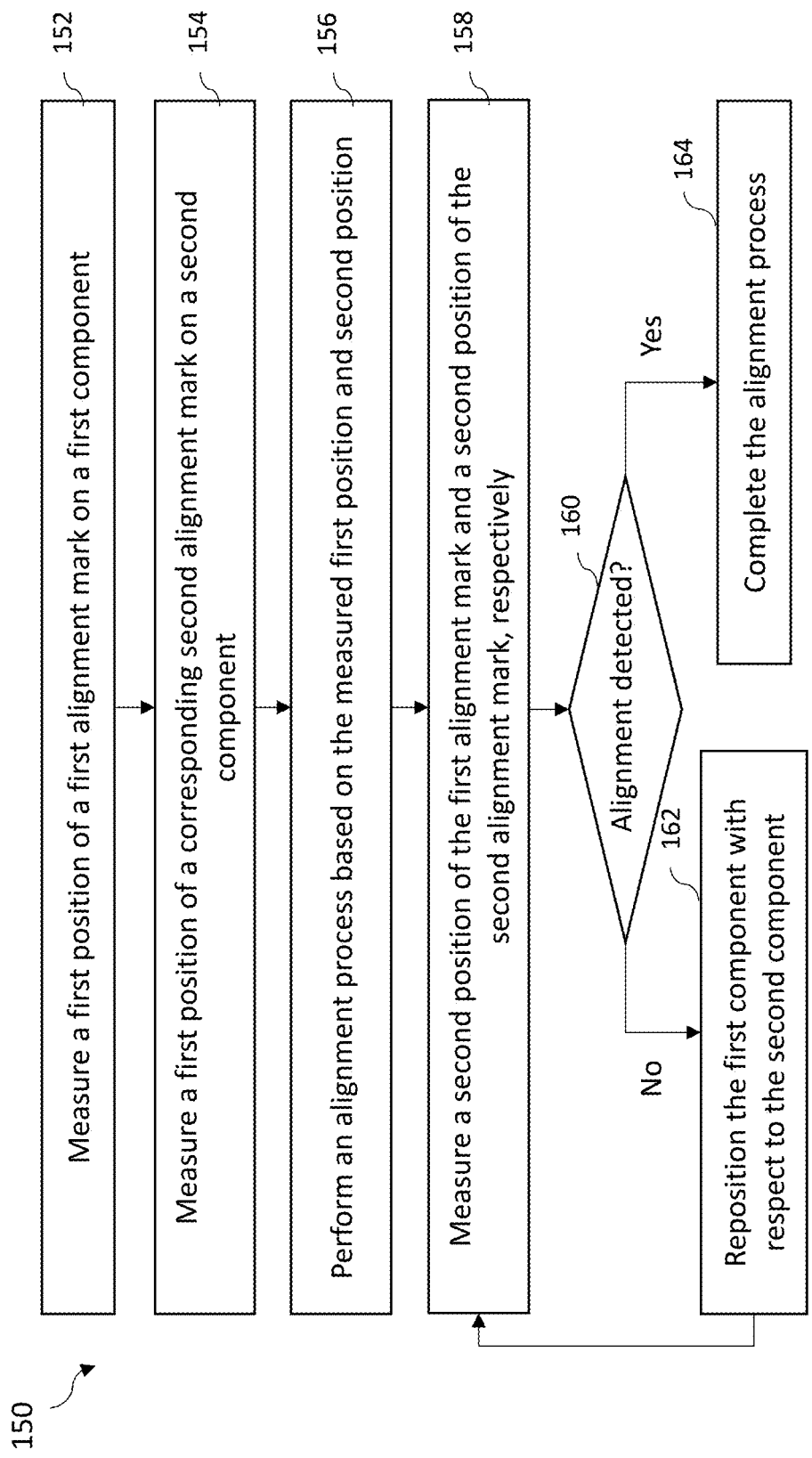

FIG. 1 illustrates a flow chart of an example method 100 for bonding or coupling surfaces of a wafer (or a substrate, e.g., a target substrate 302) and a die (e.g., a die 320) together to form a semiconductor structure (or a semiconductor package), according to some embodiments of the present disclosure. FIG. 2 illustrates a flow chart of an example method 150 for performing an alignment process between the wafer and the die, according to some embodiments of the present disclosure. It is noted that the methods 100 and 150 are merely examples and are not intended to limit the present disclosure. Accordingly, it is understood that additional operations may be provided before, during, and after the method 100 of FIG. 1 and/or the method 150 of FIG. 2, and that some other operations may only be briefly described herein.

Figure 3:
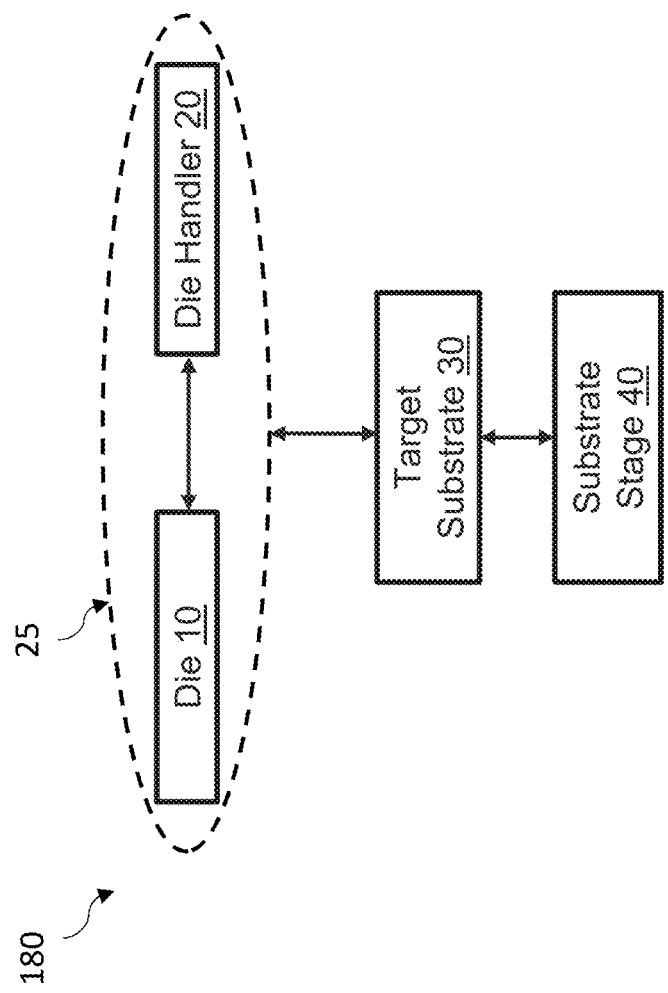
FIG. 3 illustrates a schematic process flow for performing an alignment process during intermediate stages of the example method of FIGS. 1 and/or 2, in accordance with some embodiments.
Figure 4:
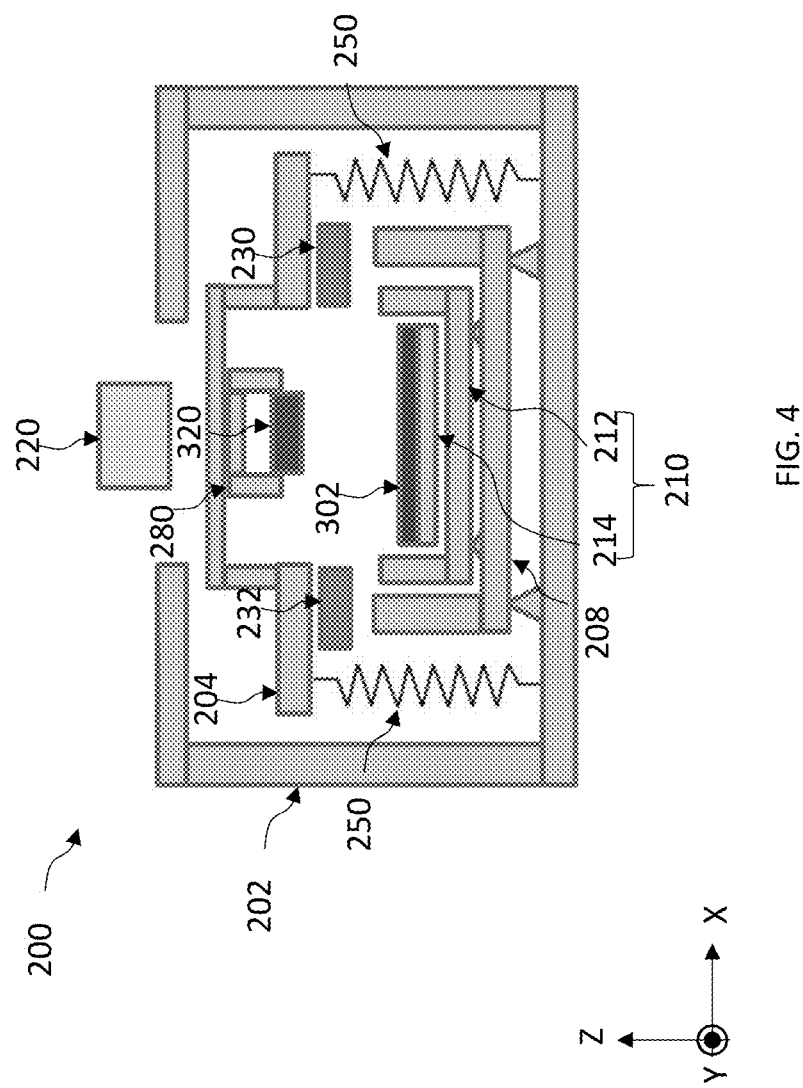
FIGS. 4 and 5 each illustrate an example apparatus for performing the example method of FIGS. 1 and/or 2, in accordance with some embodiments.
Figure 5:
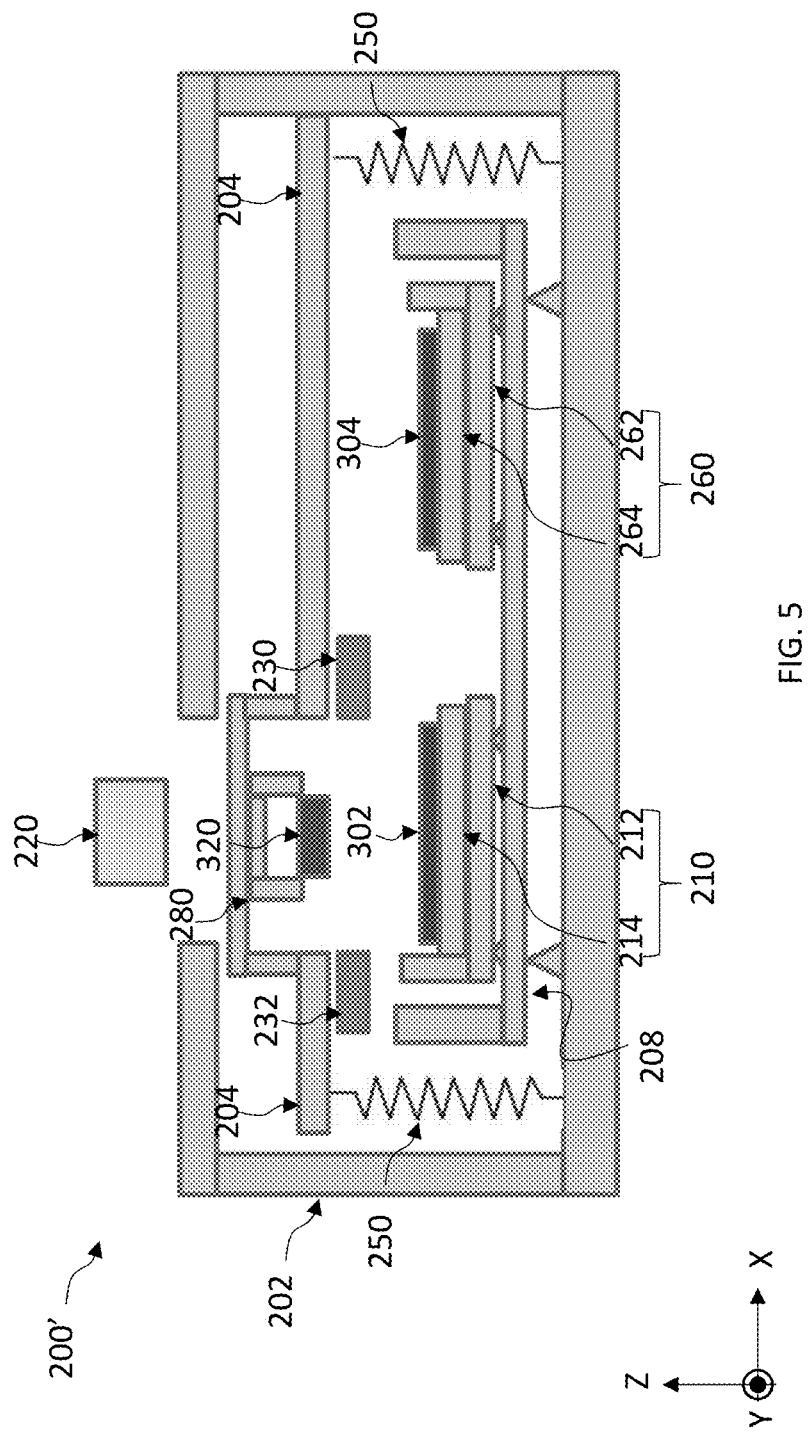

In various embodiments, operations of the methods 100 and 150 may be associated with an example wafer alignment apparatus (hereafter referred to as apparatus) 200 at various fabrication stages, which will be discussed in further detail below. It should be understood that the apparatus 200 may include a number of other components not depicted herein, while remaining within the scope of the present disclosure. The methods 100 and 150 are illustrated in FIGS. 3-13 according to some embodiments of the present disclosure. For example, FIG. 3 illustrates an embodiment of a schematic process flow for performing intermediate stages of the methods 100 and/or 150; FIGS. 4 and 5 each illustrate an embodiment of the apparatus 200 configured to perform the methods 100 and/or 150; FIGS. 6, 8, 9, 10, and 12 each illustrate a three-dimensional perspective view of the apparatus 200 during intermediate stages of the methods 100 and/or 150; FIG. 7 illustrates a top view of a portion of the apparatus 200 at an intermediate stage of the methods 100 and/or 150; FIGS. 11A and 11B each illustrate a top view of a portion of the apparatus 200 at an intermediate stage of the methods 100 and/or 150; and FIGS. 13A and 13B each illustrate a portion of the apparatus 200 at an intermediate stage of the method 100 and/or 150.

As an overview, an embodiment of the method 100 as shown in FIG. 1 includes loading a target substrate (or target wafer) onto a substrate stage, where the loading includes aligning a first set of alignment marks disposed on the target substrate and the substrate stage at operation 102. The method 100 proceeds to loading a carrier substrate (or carrier wafer) that includes a plurality of dies (or chips) onto a wafer handler at operation 104. The method 100 proceeds to positioning the carrier substrate for handling by a die handler at operation 106. In some embodiments, operations 104 and 106 may be performed concurrently. In some embodiments, operations 104 and 106 may be performed before performing operation 102. The method 100 subsequently proceeds to coupling one of the dies on the carrier substrate to the die handler, where the coupling includes aligning a second set of alignment marks disposed on the die and the die handler at operation 108. The method 100 proceeds to transporting the die to the target substrate using the die handler at operation 110. The method 100 then proceeds to coupling the die to the target substrate, where the coupling includes aligning a third set of alignment marks disposed on the target substrate and on one or both of the die and the die handler at operation 112. The method 100 subsequently proceeds to bonding (or fusing) the die to the target substrate at operation 114.

One or more operations of the method 100 as shown in FIG. 1 may be implemented by an embodiment of the method 150 as shown in FIG. 2. For example, the step of aligning the first set of alignment marks at operation 102, the step of aligning the second set of alignment marks at operation 104, and/or the step of aligning the third set of alignment marks at operation 112 may be implemented by an embodiment of the method 150. An embodiment of the method 150 includes measuring a first position of a first alignment mark on a first component (or first substrate) at operation 152. The method 150 proceeds to measuring a first position of a second alignment mark on a second component (or second substrate) at operation 154. The first component and the second component represent components to be aligned and may each be the target substrate, the substrate stage, the die, or the die handler. The method 150 then proceeds to performing an alignment process based on the measured first position and the measured second position at operation 156. The method 150 then proceeds to operation 158 to measure a second position of the first alignment mark and a second position of the second alignment mark, respectively, after performing the alignment process. On the condition that an alignment is not detected at operation 160, the method 150 proceeds to operation 162 to reposition the first component with respect to the second component. Subsequently, the method 150 repeats operations 156-160. Alternatively, on the condition that an alignment is detected at operation 160, the method 150 proceeds to operation 164 to complete the alignment process. In some embodiments, operations 158-162 may be repeated until the alignment process is completed.

FIG. 3 depicts a process flow 180 for aligning a die 10 with a target substrate 30, which is loaded to and aligned with a substrate stage 40, before performing a bonding process to fuse the die 10 with the target substrate 30. In particular, the die 10 is first coupled and aligned with a die handler 20 to form a coupled structure 25 enclosed by dotted line in FIG. 3, and the structure 25 is subsequently aligned with the target substrate 30 (and the substrate stage 40). In some examples, the target substrate 30 may be loaded to and aligned with the substrate stage 40 before forming the coupled structure 25. The alignment between any two components of the process flow 180 may be implemented by, for example, measuring positions of alignment marks disposed on the two components before and after positioning one of the two components with respect to the other. In some embodiments, the process flow 180 reflects aspects of the method 100 related to the alignment between various components described herein.

In existing implementations, bonding the die 10 with the target substrate 30 is generally preceded by coarsely aligning these components directly in a typical alignment apparatus. For example, the die 10 may be first removed from a carrier substrate and transported to the target substrate 30 using the die handler 20. The die 10 may then be positioned on the target substrate 30 after performing a coarse alignment process. In this regard, the order of alignment (e.g., accuracy in alignment) may be limited to a single pair of bonding components, i.e., the die 10 and the target substrate 30, which may be prone to limitations of the alignment apparatus and/or the metrology of the alignment process. For instances, potential misalignment between the die 10 and the target substrate 30 may be on the order of 100s of nm, which may lead to ineffective or unreliable bonding results. Limitations in the order of alignment may be especially critical to current semiconductor manufacturing technologies when feature sizes continue to decrease. Accordingly, enabling higher-order alignment and positioning for alignment between two semiconductor components (e.g., die-to-wafer, die-to-die, wafer-to-wafer, etc.) is desired.

The present disclosure provides an apparatus, and a method of using the same, for performing an alignment process between a pair of bonding substrates (e.g., die-to-die, die-to-wafer, or wafer-to-wafer). Instead of directly aligning the two substrates, an intermediate alignment process involving a first one of the bonding substrates (e.g., the die in a die-to-wafer bonding configuration) and a tool component (e.g., a die handler) is performed before positioning the two substrates for alignment. In this regard, positions of the bonding substrate and the tool component with respect to one another are measured by the apparatus and utilized to perform the subsequent alignment between the two bonding substrates with greater accuracy. In some embodiments, an additional process of aligning the second one of the substrates (e.g., the wafer in the die-to-wafer bonding configuration) with a substrate stage may be performed before positioning the two substrates for alignment, which, by a similar notion, further improves the order of alignment as a result. Although subsequent descriptions and the corresponding figures are directed to an apparatus and a method of bonding and aligning a die to a wafer, the present disclosure may be directed to bonding any two suitable substrates while remaining within the scope of the present disclosure. For example, the apparatus and the method may be directed to performing a wafer-to-wafer or a die-to-die alignment process.

Referring to FIGS. 1 and 4-7, the method 100 at operation 102 loads a target substrate 302 onto a substrate stage 210 of the apparatus 200, where the loading includes aligning a first set of corresponding alignment marks on the substrate stage 210 and the target substrate 302.

The target substrate 302 may include a semiconductor material, such as a bulk semiconductor (e.g., silicon, silicon germanium, etc.), a semiconductor-on-insulator (SOI), or the like, which may be doped (e.g., with a p-type or an n-type dopant) or undoped. The substrate may be or correspond to a respective wafer, such as a silicon wafer. Generally, an SOI includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the target substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The target substrate 302 may include a number of device features (e.g., transistors, diodes, resistors, etc.; not depicted) and a number of interconnect structures formed thereover. In some embodiments, the target substrate 302 is to be bonded to (or fused with) a die 320 to form an integrated circuit (IC) package or package component.

Referring to FIG. 4, the apparatus 200 may be configured as a dedicated system (or tool) for performing alignment of two substrates. In some embodiments, the apparatus 200 is designed to include a series of support structures to facilitate the movement (e.g., translation and rotation) of a substrate (e.g., the target substrate 302) loaded onto a substrate stage 210. For example, the apparatus 200 may be enclosed within a base frame 202 that includes both lateral segments (i.e., extending across a plane defined by the X axis and the Y axis as shown) and vertical segments (i.e., extending along the Z axis as shown). An illumination source 220 may be integrated with or disposed over the base frame 202 to provide incident light for correcting the position(s) of the bonding substrates during alignment and/or bonding process.

The substrate stage 210 may be provided on a balance mass 208, which is physically tethered to the bottom segment of the base frame 202. The substrate stage 210 includes a coarse stage 212 coupled to a fine stage 214, where the coarse stage 212 provides six-degree-of-freedom (6-DOF) of planar long stroke and the fin stage 214 provides 6-DOF of Lorentz short stroke. In other words, the substrate stage 210 is configured to provide translational and rotational movement of varying magnitudes to the target substrate 302. In some embodiments, the target substrate 302 is loaded (or mounted) directly onto the fine stage 214.

The apparatus further includes a metrology frame (or metroframe) 204 integrated with a bottom segment of the base frame 202 via a suspension system 250 configured to facilitate the measurement of metrology data during the alignment process. The suspension system 250 may include a plurality of air mounts physically attached to the metrology frame 204 and the base frame 202. Additional components may be mounted to or otherwise integrated with the metrology frame 204 over the substrate stage 210. For example, planar position encoders 230 and 232 configured to measure positional data (e.g., metrology) of the target substrate 302 and/or the substrate stage 210 may be integrated with the metrology frame 204. A die handler 280 is coupled to or integrated with the metrology frame 204 and configured to retrieve and transport a die 320 from a carrier substrate to the target substrate 302. The die handler 280 is generally configured to vertically transport the die 320 to the target substrate 302. The die handler 280 may alternatively be referred to as a pick-and-place handler. As shown, the die 320 is positioned face-down with respect to a surface 302a of the target substrate 302. The surface 302a may be a front side or a back side of the target substrate 302.

Alternative to the embodiment depicted in FIG. 4, the apparatus 200 may be configured as a double-scanner, having two separate substrate stages for processing two target substrates concurrently. Referring to FIG. 5, for example, an apparatus 200' is constructed similarly to the apparatus 200 with the exception that the apparatus 200' includes an additional substrate stage 260 laterally adjacent the substrate stage 210. The substrate stage 260 is provided on the balance mass 208 and includes a coarse stage 262 integrated with a fine stage 264, which are generally analogous to the coarse stage 212 and the fin stage 214. As shown, the substrate stage 260 is loaded with a target substrate 304, which can be processed separately from the target substrate 302. In some embodiments, while the target substrate 302 is loaded, measured, and aligned with the die 320 at the substrate stage 210, the target substrate 304, which has already been aligned with another die or dies, undergoes a bonding process (e.g., operation 114 of the method 100). In this regard, the apparatus 200' also provides a substrate transfer system (not depicted) between the substrate stage 210 and the substrate stage 260 to facilitate the operation of both scanners.

For purposes of illustration, the subsequent operations of the methods 100 and 150 are described with reference to the target substrate 302 and the substrate stage 210 as a part of the apparatus 200 of FIG. 4. For this reason, depiction of the apparatus 200 has been simplified in subsequent figures to include only the substrate stage 210, the illumination source 220, and the die handler 280.

Figure 6:
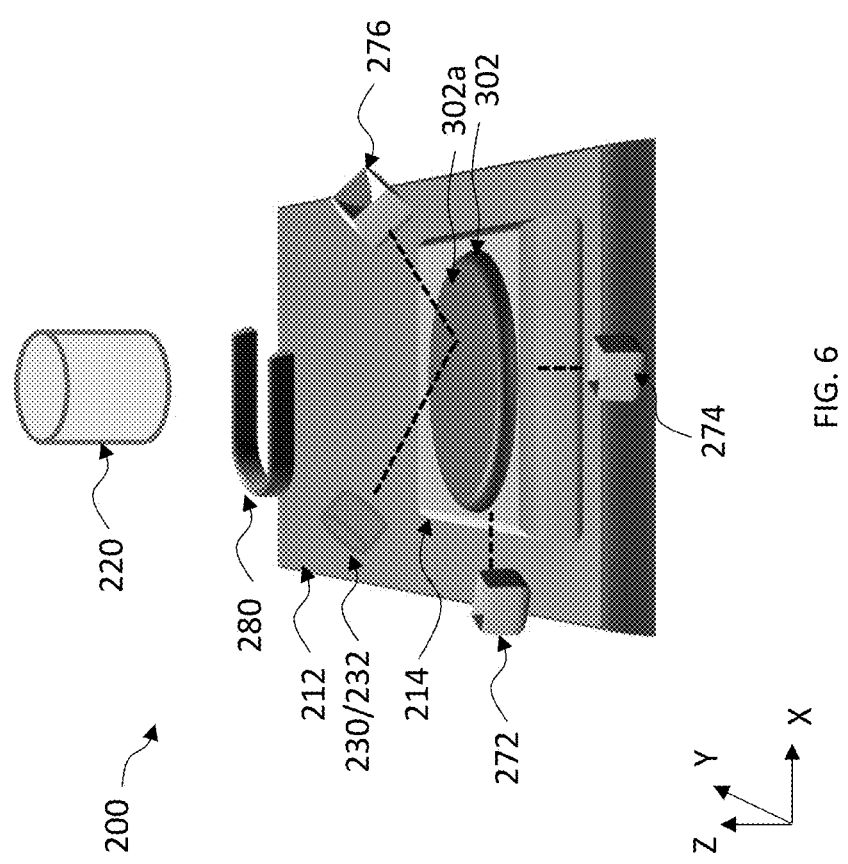
FIGS. 6, 8, 9, 10, and 12 each illustrate a three-dimensional perspective view of the example apparatus as shown in FIGS. 4 and/or 5 during intermediate stages of the example method of FIGS. 1 and/or 2, in accordance with some embodiments.
Figure 7:
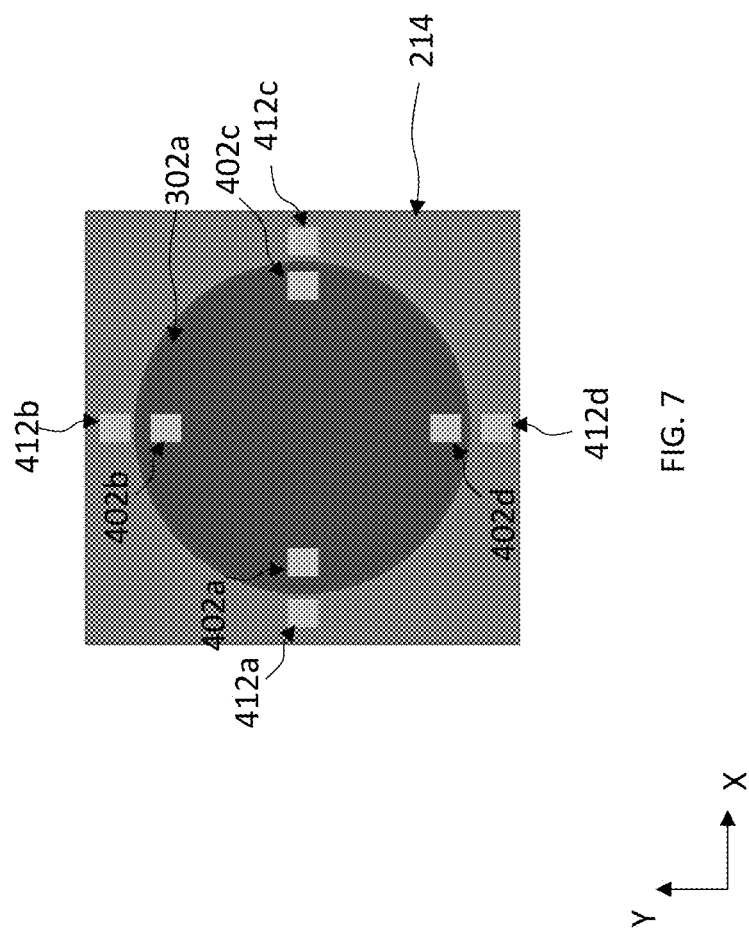
FIG. 7 illustrates a top view of a portion of the example apparatus of FIGS. 4 and/or 5 at an intermediate stage of the example method of FIGS. 1 and/or 2 as shown in FIG. 6, in accordance with some embodiments.

FIG. 6 illustrates the apparatus 200 with the target substrate 302 loaded onto the substrate stage 210 (depicted as the coarse stage 212 and the fine stage 214). In some embodiments, loading the target substrate 302 includes placing the target substrate 302 onto the fine stage 214 and subsequently aligning the target substrate 302 with the fine stage 214 utilizing alignment marks disposed on both the target substrate 302 and the fine stage 214. For example, referring to FIG. 7, the surface 302a of the target substrate 302 includes a set of alignment marks 402a, 402b, 402c, and 402d (collectively referred to as alignment marks 402a-402d) arranged symmetrically over the target substrate 302, and the fine stage 214 includes a set of alignment marks 412a, 412b, 412c, and 412d (collectively referred to as alignment marks 412a-412d) corresponding to the alignment marks 402a-402d, respectively. The depicted arrangement of these and any subsequent alignment marks is for illustration purposes only with the understanding that other arrangements may also be applicable in the present disclosure. For example, the surface 302a may include more or less of the alignment marks similar to the alignment marks 402a-402d, and that such alignment marks may not necessarily be arranged symmetrically over the surface 302a.

In some embodiments, referring to FIG. 2, the process of aligning the target substrate 302 with the fine stage 214 (i.e., the substrate stage 210) may be implemented by an embodiment of the method 150. For example, the method 150 measures position(s) of one or more of the alignment marks 402a-402d at operation 152 and subsequently measures position(s) of one or more of the alignment marks 412a-412d at operation 154. In some embodiments, positions of the various alignment marks may be measured by a metrology technique, such as an optical method (e.g., using a lens system integrated with the apparatus 200), a diffraction method, scatterometry, interferometry, or combinations thereof. In some embodiments, measuring the positions of the alignment marks may rely on the use of the illumination source 220 to reposition the target substrate 302 or the fine stage 214. In some embodiments, the positions of the alignment marks 402a-402d and the alignment marks 412a-412d are measured using different tools. For example, referring to FIG. 6, an alignment detection module including a detection element 272 and a detection element 274 may be integrated with the apparatus 200 to measure the position(s) of one or more of the alignment marks 412a-412d on the fine stage 214. The alignment detection module further includes the planar position encoders 203/232 coupled with a photodetector 276, which are integrated with the apparatus 200 to measure the position(s) of one or more of the alignment marks 402a-402d on the target substrate 302. The alignment detection module may rely on one or more of the metrology techniques provided herein to measure the positions of the various alignment marks.

Subsequently, based on the measured positions of the alignment marks 402a-402d and 412a-412d, which may be collectively considered as a set of corresponding alignment marks, the method 150 at operation 156 aligns the target substrate 302 with respect to the fin stage 214. In some embodiments, the aligning at operation 156 is implemented by adjusting the position of the target substrate 302, the fine stage 214, or both.

The method 150 at operation 158 measures the resulting positions of the alignment marks 402a-402d and 412a-412d, respectively, after performing an initial alignment process. On the condition that alignment is not detected ("No" at operation 160), the method 150 proceeds to repositioning or realigning the target substrate 302 with respect to the fine stage 214 at operation 162 and subsequently measuring the resulting positions of their respective alignment marks at operation 158. Alternatively, on the condition that alignment is detected ("Yes" at operation 160), the method 150 proceeds to operation 164 to complete the alignment process.

Figure 8:
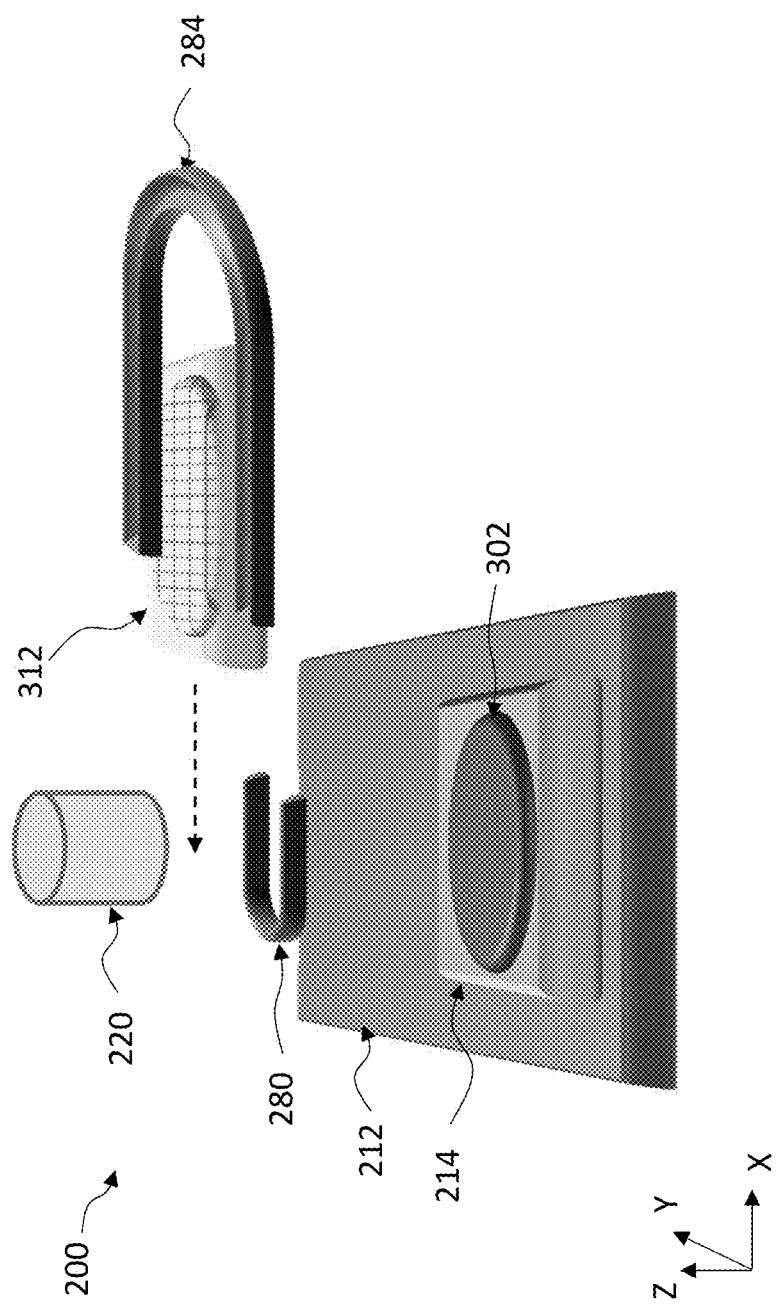

Now referring to FIGS. 1 and 8, the method 100 at operation 104 proceeds to loading a carrier substrate 312 onto a wafer handler 284, where the carrier substrate 312 includes a plurality of dies 320 disposed thereon. In some embodiments, the carrier substrate 312 is loaded with the dies 320 facing downward, i.e., toward the target substrate 302.

Figure 9:
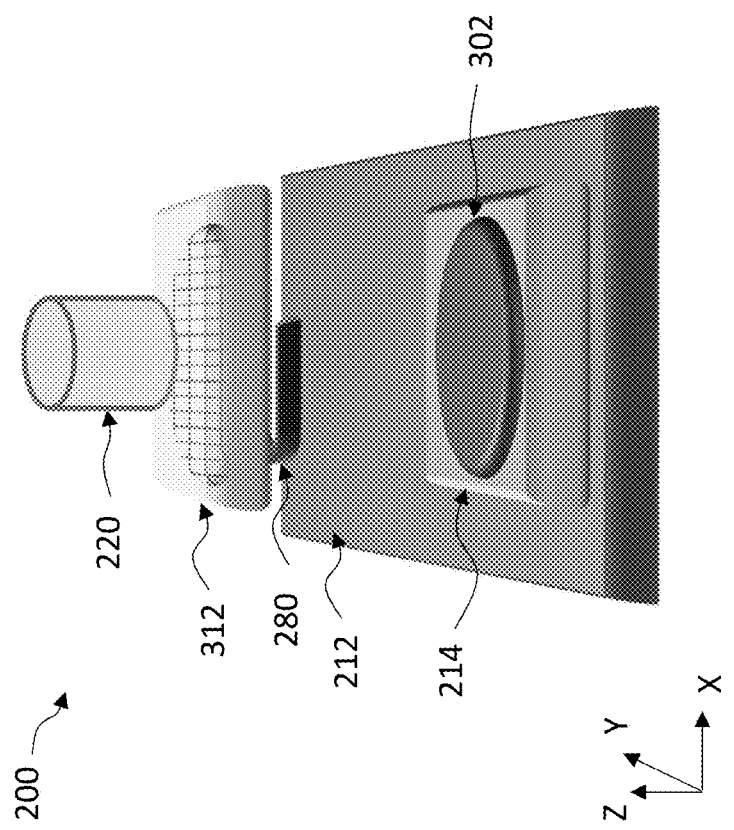

Referring to FIGS. 1 and 9, the method 100 at operation 106 proceeds to positioning the carrier substrate 312 for handling by the die handler 280. As shown, because the die 320 faces downward on the carrier substrate 312, the wafer handler 284 is configured to transport and position the carrier substrate 312 at a position over the die handler 280, i.e., between the die handler 280 and the illumination source 220 as depicted.

Figure 10:
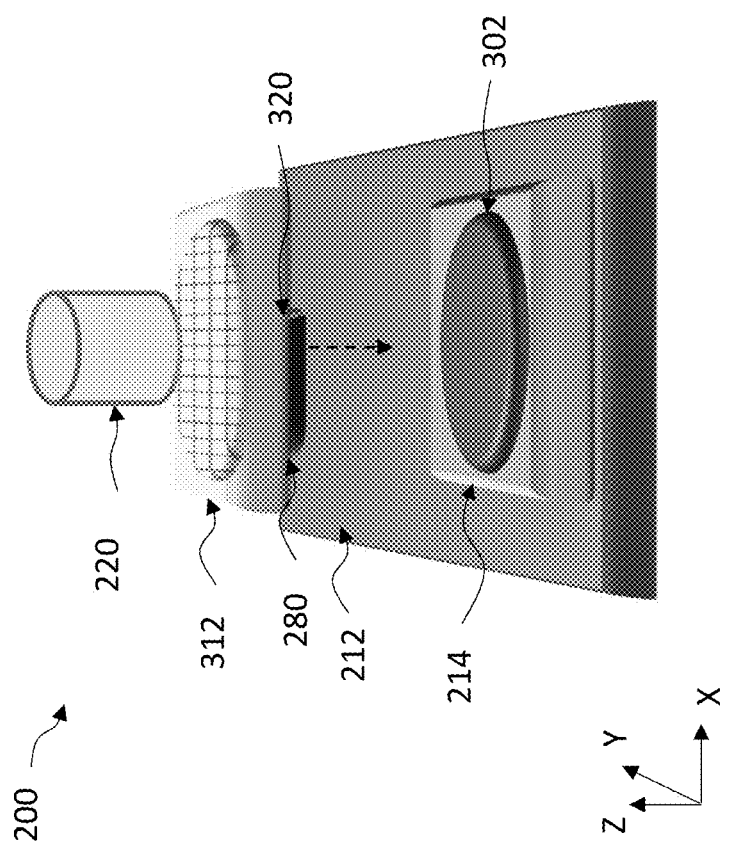
Figure 11:
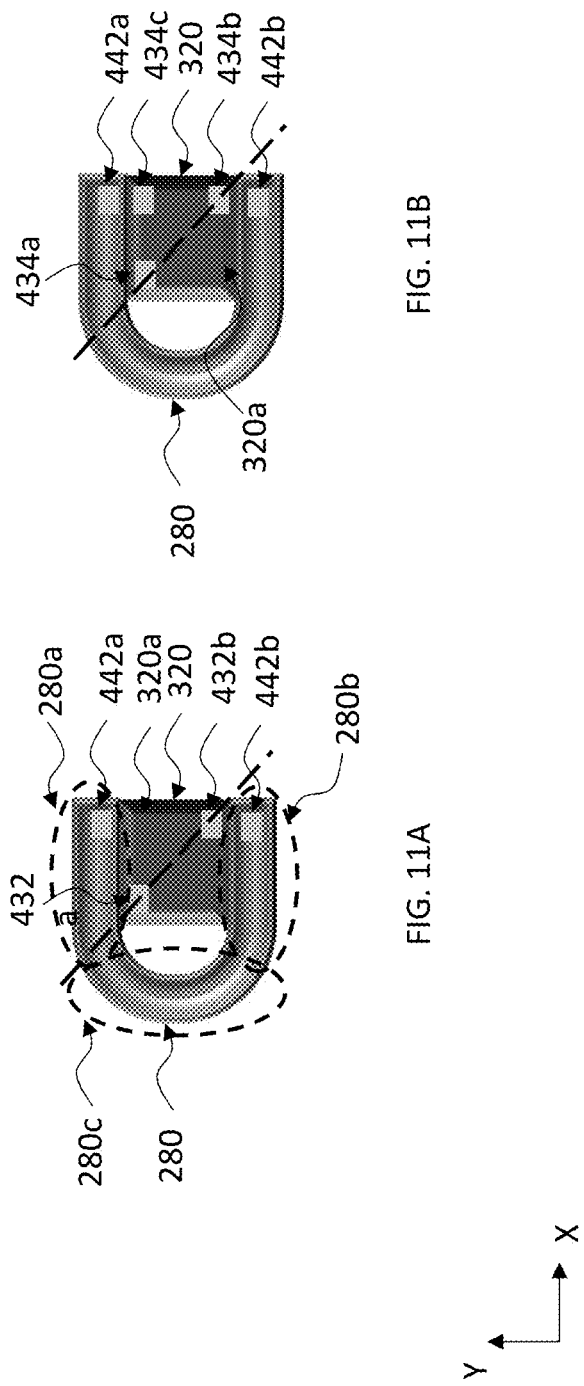
FIGS. 11A and 11B each illustrate a top view of a portion of the example apparatus of FIGS. 4 and/or 5 at an intermediate stage of the example method of FIGS. 1 and/or 2 as shown in FIG. 10, in accordance with some embodiments.

Referring to FIGS. 1 and 10, the method 100 at operation 108 proceeds to coupling the die 320 with the die handler 280, where the coupling includes aligning a second set of corresponding alignment marks on the die 320 and the die handler 280.

In some embodiments, the die handler 280 is configured as a U-shaped structure, having a segment 280a connected to a segment 280b through a curved segment 280c, where both the segments 280a and 280b are substantially straight (or leveled with a horizontal plane). Accordingly, a space interposed between the segments 280a and 280b is designed to receive the die 320, such that edges of the die 320 directly contact the segments 280a and 280b when coupled. In the depicted embodiments, the die handler 280 couples with the die 320 along a lateral direction (e.g., along the X axis a shown in FIG. 10), allowing the die 320 to fit between the segments 280a and 280b. In some embodiments, the die handler 280 may have a different configuration and may couple with the die 320 from a vertical direction (e.g., along the Z axis as shown in FIG. 10). In some embodiments, the coupling between the die 320 and the die handler 280 may be by means of vacuum suction, where vacuum tracks are provided within the segments 280a and 280b and emerge at an interface between each of the segments and the die 320.

An application of negative pressure holds the die 320 in the space between the segments 280a and 280b. Other means of coupling the die 320 to the die handler 280 may also be applicable in the present disclosure.

In some embodiments, coupling the die 320 with the die handler 280 includes aligning the die 320 with the die handler 280 utilizing alignment marks disposed on both the die 320 and the die handler 280. For example, referring to FIG. 11A, the die 320 includes, on its surface 320a, a set of two alignment marks 432a and 432b arranged opposite to one another along a diagonal axis (dashed line in FIG. 11A) of the die 320, and the die handler 280 includes a set of two alignment marks 442a and 442b corresponding to the alignment marks 432a and 432b, respectively. In this regard, an alignment between the die 320 and the die handler 280 is established when the alignment mark 432b is aligned with the alignment mark 442b, while the alignment mark 432a is offset from both the alignment marks 442a and 442b. Referring to FIG. 11B, the die 320 includes a set of three alignment marks 434a, 434b, and 434c on its surface 320a, where the alignment marks 434b and 434c are vertically aligned, and the alignment mark 434a is opposite to the alignment mark 434b along a diagonal axis of the die 320.

In some embodiments, the process of aligning the die 320 with the die handler 280 is similar to the process of aligning the target substrate 302 with the substrate stage 210 and may be implemented by an embodiment of the method 150. For example, referring to FIG. 2, the method 150 measures position(s) of one or more of the alignment marks 432a and 432b (or 434a-434c) at operation 152 and subsequently measures position(s) of one or more of the alignment marks 442a and 442b at operation 154, using one or more of the metrology techniques provided herein.

Subsequently, based on the measured positions of the alignment marks 432a and 432b (or 434a-434c) and 442a and 442b, which may be collectively considered as a set of corresponding alignment marks, the method 150 at operation 156 aligns the die 320 with the die handler 280. In some embodiments, the aligning at operation 156 is implemented by adjusting the position of the die 320, the die handler 280, or both.

The method 150 at operation 158 measures the resulting positions of the alignment marks 432a and 432b (or 434a-434c) and 442a and 442b, respectively, after performing the alignment process. On the condition that alignment is not detected ("No" at operation 160), the method 150 proceeds to repositioning or realigning the die 320 with respect to the die handler 280 at operation 162 and subsequently measuring the resulting positions of their respective alignment marks at operation 158. Alternatively, on the condition that alignment is detected ("Yes" at operation 160), the method 150 proceeds to operation 164 to complete the alignment process.

Figure 12:
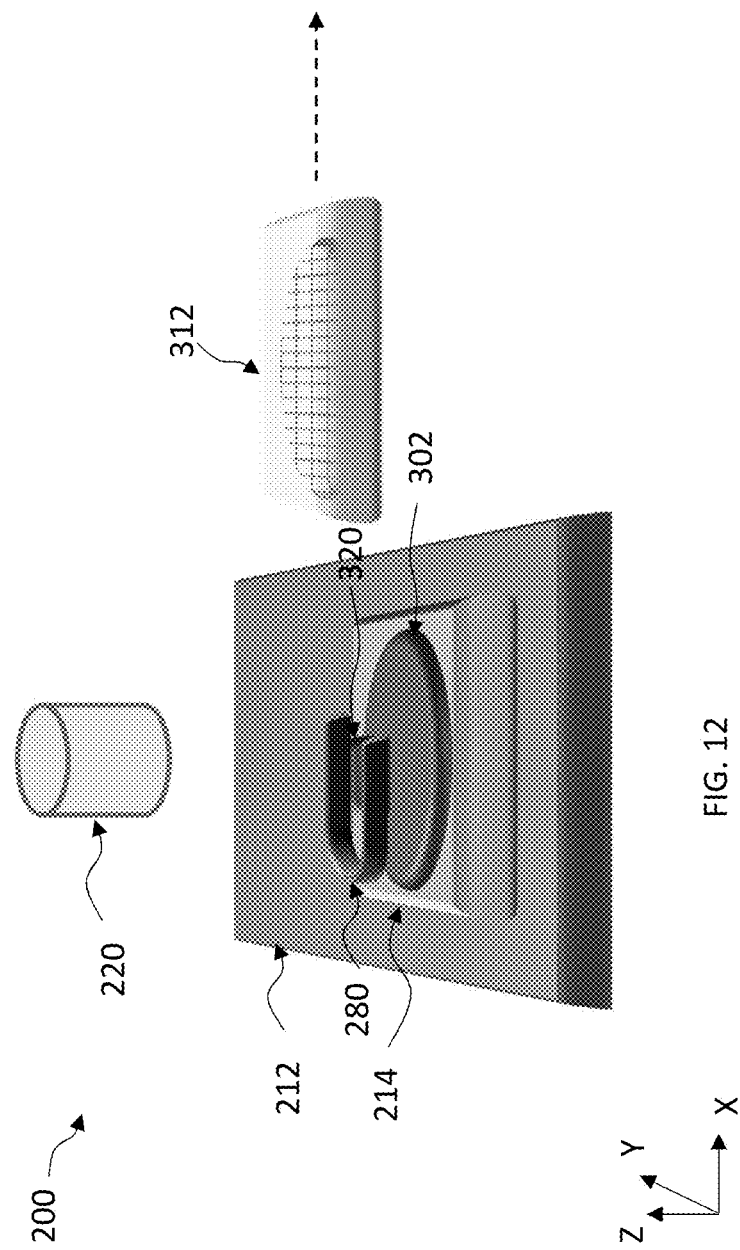

Referring to FIGS. 1 and 12, the method 100 at operation 110 proceeds to transporting the die 320 to the target substrate 302 using the die handler 280, and subsequently removing the carrier substrate 312 using the wafer handler 284, for example. In some embodiments, transporting the die 320 includes removing the die 320 coupled to the die handler 280 from the carrier substrate 312 and moving the die 320 towards the target substrate 302 using the die handler 280.

Figures 13A, 13B:
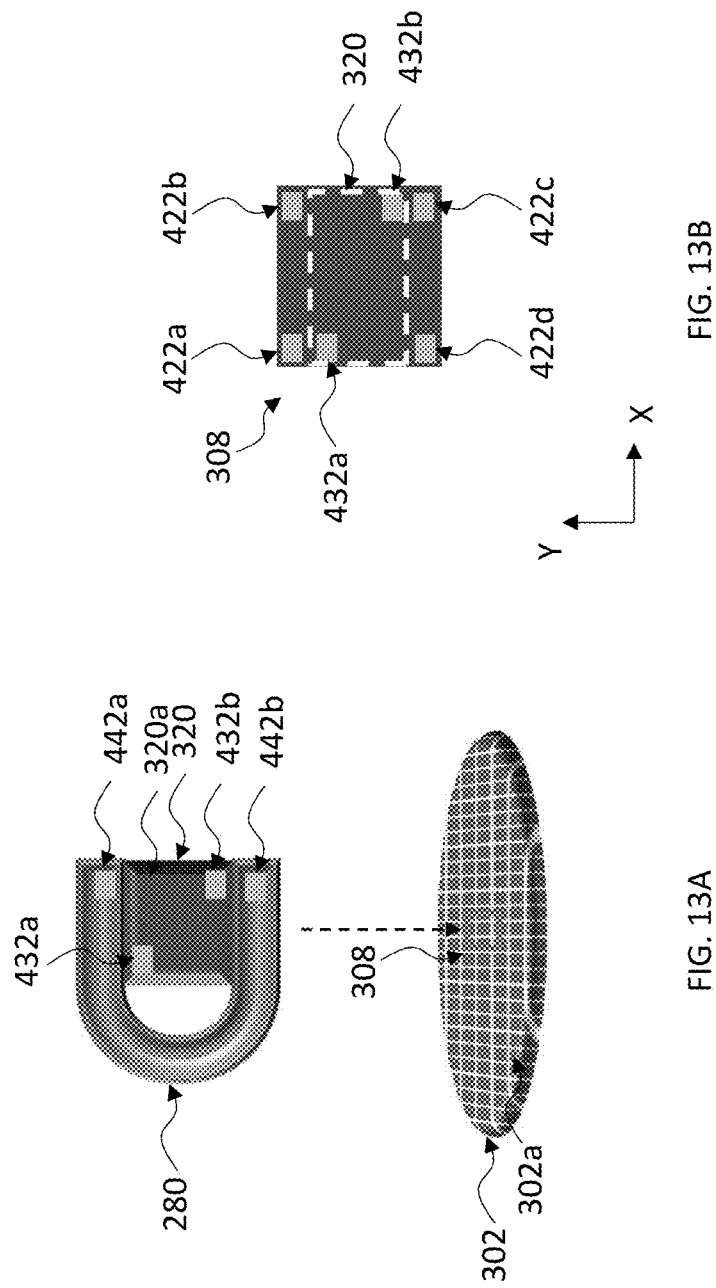
FIGS. 13A and 13B each illustrate a portion of the example apparatus of FIGS. 4 and/or 5 at an intermediate stage of the example method of FIGS. 1 and/or 2 as shown in FIG. 12, in accordance with some embodiments.

Thereafter, referring to FIGS. 1, 13A, and 13B, the method 100 at operation 112 proceeds to coupling the die 320, which is also coupled to the die handler 280, to the target substrate 302, where the coupling includes aligning a third set of alignment marks.

Referring to FIGS. 13A and 13B, the surface 302a of the target substrate 302 includes a plurality of regions 308, at least one of which is configured to receive the die 320. In the present embodiments, each region 308 includes alignment marks 422a, 422b, 422c, 422d (collectively referred to as 422a-422d) arranged at each corner of the region 308. In this regard, aligning the die 320 with the region 308 (i.e., the target substrate 302) may be implemented by aligning at least one of the alignment marks 432a and 432b (or the alignment marks 434a-434c) of the die 320 or one of the alignment marks 442a and 442b of the die handler 280 with at least one of the alignment marks 422a-422d.

In the depicted embodiment, referring to FIG. 13B, the die 320 is aligned with the target substrate 302 by aligning the alignment marks 432a and 432b on the die 320 with the corresponding alignment marks 422a-422d (e.g., 422a and 422c) in the region 308. In some embodiments, referring to FIG. 13A, aligning the die 320 with the target substrate 302 may be implemented by aligning one or both of the alignment marks 442a and 442b located on the die handler 280 with the corresponding alignment marks 422a-422d (e.g., 422b and 422c). In some embodiments, aligning the die 320 with the target substrate 302 may be implemented by aligning one of the alignment marks 432a and 432b or one of the alignment marks 442a and 442b with the corresponding alignment marks 422a-422d (e.g., 422a, 422b, and 422c). The additional alignment process between the die 320 and the die handler 280 allows additional alignment marks to be utilized during the alignment process between the die 320 and the target substrate 302, thereby improving the order of alignment of the overall process. In some examples, methods provided in the present disclosure may reduce the degree of misalignment (in nm) by at least one order of magnitude.

In some embodiments, the process of aligning the die 320 with the target substrate 302 is similar to the process of aligning the target substrate 302 with the substrate stage 210 and may be implemented by an embodiment of the method 150. For example, referring to FIG. 2, the method 150 measures position(s) of one or more of the alignment marks 432a and 432b at operation 152 and subsequently measures position(s) of one or more of the alignment marks 422a-422d at operation 154, using one or more of the metrology techniques provided herein. Subsequently, based on the measured positions of the alignment marks 432a and 432b and 422a-422d, the method 150 at operation 156 aligns the die 320 with the die handler 280. In some embodiments, the aligning at operation 156 is implemented by adjusting the position of the die 320, the target substrate 302, or both. Then, the resulting positions of the alignment marks 432a and 432b and 422a-422d are measured at operation 158. If alignment is not detected at operation 160, then the method 150 proceeds to a repositioning or realignment process at operation 162, followed by repeated alignment detection. If alignment is detected at operation 160, the alignment process is completed at operation 162. After coupling the die 320 to the target substrate 302, the die 320 is released by the die handler 280.

Referring to FIG. 1, the method 100 at operation 114 proceeds to bonding the die 320 to the target substrate 302.

In some embodiments, referring to FIG. 5 as an example, bonding the die 320 to the target substrate 302 may include transferring the die 320 coupled to and aligned with the target substrate 302 from the substrate stage 210 to the substrate stage 260 in the apparatus 200'. As a result, the substrate stage 210 is free to receive another target substrate awaiting to be aligned with another die. The die 320 and the target substrate 302 may be bonded (or fused) by any suitable process, such as by a hybrid bonding process, to form bonds at metal-to-metal interface and at dielectric-to-dielectric interface between the bonding surfaces. In the depicted embodiments, the die 320 is bonded face-down to the target substrate 302. Other types of bonding processes may also be applicable in the present disclosure.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
    positioning a target substrate on a substrate stage, the target substrate having a first alignment mark;
    providing a die with a second alignment mark;
    positioning the die with respect to a die handler, wherein the die handler includes a third alignment mark, and wherein the die is aligned with the die handler using the second alignment mark on the die and the third alignment mark on the die handler;
    transporting the die to the target substrate using the die handler,
    wherein the die and the die handler are aligned with the target substrate using the first alignment mark on the target substrate and at least one of the second alignment mark on the die or the third alignment mark on the die handler; and
    bonding the die with the target substrate.

2. The method of claim 1, comprising aligning the second alignment mark with the third alignment mark, wherein the aligning the second alignment mark with the third alignment mark comprises:
    measuring a first position of the second alignment mark;
    measuring a second position of the third alignment mark; and
    aligning the die with the die handler based on the measured first position and second position.

3. The method of claim 1, further comprising performing at least one of an optical analysis, a diffraction analysis, and a scatterometry analysis for aligning the second alignment mark with the third alignment mark or aligning the first alignment mark with at least one of the second alignment mark or the third alignment mark.

4. The method of claim 1, wherein the substrate stage includes a fourth alignment mark, and wherein positioning the target substrate includes aligning the first alignment mark with the fourth alignment mark.

5. The method of claim 1, wherein the die further includes a fifth alignment mark, and wherein coupling the die to the die handler includes aligning the fifth alignment mark with the third alignment mark.

6. The method of claim 1, wherein the die further includes a fifth alignment mark, and wherein positioning the coupled die and the die handler over the target substrate includes aligning the first alignment mark with one or combinations of: the third alignment mark, the second alignment mark, and the fifth alignment mark.

7. The method of claim 1, wherein the die further includes a fifth alignment mark positioned diagonally from the second alignment mark, such that coupling the die to the die handler results in the fifth alignment mark to be offset from the third alignment mark.

8. The method of claim 1, wherein a surface of the target substrate includes a region configured to receive the die, and wherein the first alignment mark is positioned at a corner of the region.

9. A method, comprising:
    loading a target substrate onto a substrate stage, wherein the target substrate includes a first alignment mark;
    providing a die having a second alignment mark;
    coupling the die with a die handler, wherein the die handler includes a third alignment mark, and wherein the die is aligned with the die handler using the second alignment mark on the die and the third alignment mark on the die handler;
    transporting the die to the target substrate using the die handler, wherein the die and the die handler are aligned with the target substrate using the first alignment mark on the target substrate and at least one of the second alignment mark on the die or the third alignment mark on the die handler; and
    performing a bonding process to fuse the target substrate with the die.

10. The method of claim 9, wherein the substrate stage includes a fourth alignment mark, and wherein the step of loading the target substrate includes performing a third alignment process to align the target substrate with the substrate stage using the first alignment mark and the fourth alignment mark.

11. The method of claim 9, comprising performing an alignment process to align the die with the die handler using the second alignment mark and the third alignment mark, wherein the performing the alignment process comprises:

measuring a first position of the second alignment mark;

measuring a second position of the third alignment mark; and aligning the die with the die handler based on the measured first position and second position.

12. The method of claim 9, further comprising performing at least one of an optical analysis, a diffraction analysis, and a scatterometry analysis for performing one or more alignment processes.

13. The method of claim 9, wherein the die further includes a fifth alignment mark positioned diagonally from the second alignment mark, such that performing a first alignment process results in the fifth alignment mark to be offset from the third alignment mark.

14. The method of claim 9, wherein the die further includes a fifth alignment mark, and wherein performing a first alignment process results in an alignment between the fifth alignment mark and the third alignment mark.

15. The method of claim 9, wherein the die further includes a fifth alignment mark, and wherein performing a second alignment process results in an alignment between the first alignment mark and one or combinations of: the second alignment mark, the third alignment mark, and the fifth alignment mark.

16. The method of claim 9, wherein a first surface of the target substrate includes a region configured to receive the die, and wherein the first alignment mark is positioned at a corner of the region.

17. An apparatus, comprising:

a substrate stage configured to receive and move a target substrate, wherein the substrate stage includes a first alignment mark;

an alignment detection module configured to facilitate an alignment process of the target substrate;

a die handler configured to transport a die having a second alignment mark to the target substrate, wherein the die handler includes a third alignment mark, wherein the die is aligned with the die handler using the second alignment mark on the die and the third alignment mark on the die handler, and wherein the die and the die handler are aligned with the target substrate using the first alignment mark on the target substrate and at least one of the second alignment mark on the die or the third alignment mark on the die handler.

18. The apparatus of claim 17, wherein the alignment detection module is configured to detect alignment of the target substrate by optical inspection, diffraction, scatterometry, interferometry, or combinations thereof.

19. The apparatus of claim 17, wherein the die handler includes a first straight portion connected to a second straight portion by a curved portion to form a U-shape, and wherein the third alignment mark is disposed on one of the first straight portion or the second straight portion of the die handler.

20. The apparatus of claim 17, wherein the substrate stage is a first substrate stage, wherein the apparatus further comprises a second substrate stage coupled to the first substrate stage, and wherein the second substrate stage is configured to bond the die to the target substrate.

* * * * *